United States Patent [19]

Tseng

[11] Patent Number: 5,688,706
[45] Date of Patent: Nov. 18, 1997

US005688706A

[54] METHOD FOR FABRICATING A MOSFET DEVICE, WITH LOCAL CHANNEL DOPING, SELF ALIGNED TO A SELECTIVELY DEPOSITED TUNGSTEN GATE

[75] Inventor: Horng-Huei Tseng, Hsinchu, Taiwan

[73] Assignee: Vanguard International Semiconductor Corporation, Hsin-Chu, Taiwan

[21] Appl. No.: 691,290

[22] Filed: Aug. 1, 1996

[51] Int. Cl.⁶ .................................................. H01L 21/266
[52] U.S. Cl. .............................. 437/45; 437/44; 437/192; 437/984
[58] Field of Search ............................. 437/44, 45, 192, 437/984; 148/DIG. 111

[56] References Cited

U.S. PATENT DOCUMENTS

| | | | |
|---|---|---|---|
| 5,219,777 | 6/1993 | Kang | 437/45 |
| 5,413,949 | 5/1995 | Hong | 437/44 |
| 5,464,782 | 11/1995 | Koh | 437/45 |
| 5,489,543 | 2/1996 | Hong | 437/41 |
| 5,504,038 | 4/1996 | Chien et al. | 437/192 |

*Primary Examiner*—Chandra Chaudhari
*Attorney, Agent, or Firm*—George O. Saile; Stephen B. Ackerman

[57] ABSTRACT

A process has been developed in which a deep submicron MOSFET device has been fabricated, featuring a local, narrow threshold voltage adjust region, in a semiconductor substrate, with the local, narrow threshold voltage adjust region, self aligned to an overlying, narrow tungsten-polysilicon gate structure. The process consists of forming a narrow hole opening in an insulator layer, where the insulator layer overlies a polysilicon layer and a gate insulator layer. An ion implantation procedure, through the polysilicon layer, and gate insulator layer, is used to place a narrow threshold voltage adjust region in the specific area of the semiconductor substrate, underlying the narrow hole opening. Selective deposition of tungsten results in the creation of a tungsten gate structure, in the narrow hole opening, on the top surface of the polysilicon layer. Patterning of the polysilicon layer, using the overlying tungsten gate structure as a mask, results in an polysilicon gate structure, underlying the tungsten gate structure, in the narrow hole opening. The composite narrow tungsten-polysilicon gate structure is self aligned to the underlying, local, narrow threshold voltage adjust region.

20 Claims, 3 Drawing Sheets

METHOD FOR FABRICATING A MOSFET DEVICE, WITH LOCAL CHANNEL DOPING, SELF ALIGNED TO A SELECTIVELY DEPOSITED TUNGSTEN GATE

BACKGROUND OF THE INVENTION (1) Feils of the Invention

The present invention relates to a process in which a metal oxide semiconductor field effect transistor, (MOSFET), device is fabricated, and more specifically to a process used to fabricate a MOSFET device, with a local threshold adjust region, self aligned to an overlying tungsten gate, obtained via selective deposition procedures.

(2) Description of Prior Art

Micro-miniaturazation, or the ability of the semiconductor industry to fabricate MOSFET devices, with submicron features, has resulted in cost reductions, as well as performance increases, for semiconductor chips. The smaller device features allow the desired circuit density to be obtained on smaller chips, thus allowing a greater number of chips to be produced from a specific size starting substrate, thus reducing the fabrication costs of a specific chip. In addition devices fabricated with smaller, or submicron features present less parasitic capacitance, then counterparts fabricated with larger features, thus resulting in performance benefits. The ability to achieve micro-miniaturization has been realized via advances in specific semiconductor fabrication disciplines, mainly photolithograhy and anisotropic dry etching. For example the use of more sophisticated exposure cameras, as well as the development of more sensitive photoresist materials, has resulted in the routine attainment of submicron images in photoresist layers. In turn the development of reactive ion etching, (RIE), tools and processes, have allowed the submicron images in photoresist layers to be easily transferred to underlying materials used in the fabrication of semiconductor devices.

MOSFET devices with channel lengths less then 0.35 uM, or deep submicron MOSFET devices, are now being fabricated, and do result in improved device performance. The smaller features of the deep submicron MOSFET device do result in a decrease in parasitic capacitances, which in turn results in a performance increase, when compared to MOSFET counterparts, fabricated with larger dimensions. However a specific area of the deep submicron MOSFET device, the threshold voltage adjust region, created in the channel region of the MOSFET device, still results in a significant level of junction capacitance, due to the increased doping level of the threshold adjust region, adversely influencing device performance. This threshold adjust region is usually placed in the channel region of the MOSFET device, spreading beyond the area needed for threshold voltage adjustment, thus adding the unwanted junction capacitance. This invention will describe a fabrication method for creating deep submicron MOSFET devices, in which the unwanted junction capacitance, resulting from a threshold voltage adjust region, is reduced. This is accomplished by restricting the width of threshold voltage adjust region to a width identical to the width of a narrow gate structure. The ability to self align the narrow gate structure to a local threshold voltage adjust region, is accomplished via a unique processing procedure, featuring an ion implantation step, in a narrow hole opened in an insulator layer, and through a blanket polysilicon and gate insulator layer, creating the local threshold adjust region. A selective deposition of tungsten, followed by the removal of the insulator layer, and definition of the underlying polysilicon gate structure, using the tungsten gate as a mask, result in the creation of the narrow tungsten-polysilicon gate structure, self aligned to the local threshold voltage adjust region. Prior art such as Koh, in U.S. Pat No. 5,464,782, describes the formation of a threshold voltage adjust region in an opening in a insulator layer, followed by formation of a polysilicon gate structure. However Koh does not describe a process for self aligning, or restricting the threshold voltage adjust region, to a region directly underlying the polysilicon gate structure.

SUMMARY OF THE INVENTION

It is an object of this invention to fabricate a deep submicron MOSFET device using a local, narrow threshold voltage adjust region.

It is another object of this invention to create a local, narrow threshold voltage adjust region, in a semiconductor substrate, via an ion implantation of dopants through a blanket polysilicon layer, through a gate insulator layer, and into a local region of a semiconductor substrate, defined by a narrow hole opening, in an insulator layer.

It is still another object of this invention to selectively deposit a tungsten layer on the top portion of the polysilicon layer, exposed in the narrow hole opening in an insulator layer, forming a tungsten gate structure in the narrow hole opening.

It still yet another object of this invention to use the tungsten gate structure as a mask, to define an underlying, narrow polysilicon gate structure, equal in width to the width of the narrow hole opening in an insulator layer, and self aligned to an underlying local, narrow threshold voltage adjust region.

In accordance with the present invention a process for fabricating a deep submicron MOSFET device, using a narrow tungsten-polysilicon gate structure, self aligned to a local, narrow threshold voltage adjust region, is described. A gate insulator layer is thermally grown on the surface of a semiconductor substrate. A polysilicon layer is deposited, followed by the deposition of an insulator layer. Photolithographic and reactive ion etching, (RIE), procedures are used to create a narrow hole opening in the insulator layer, to expose the top surface of the polysilicon layer. An ion implantation procedure is performed, through the polysilicon layer, and through the gate insulator layer, in the narrow hole opening in the insulator layer, creating a local, narrow threshold adjust region in the channel region of the semiconductor substrate. A selective deposition of tungsten, forms a tungsten gate structure on the top surface of the polysilicon layer, in the narrow hole opening. Removal of the insulator layer exposes a tungsten gate structure, overlying a blanket polysilicon layer. The tungsten gate structure is then used as a mask to define a narrow polysilicon gate structure, with the resulting narrow tungsten-polysilicon gate structure, directly overlying, and self aligned to, an underlying local, narrow threshold adjust region. Lightly doped source and drain regions are next formed, followed by the deposition of another insulator layer, and anisotropic RIE procedures, used to create an insulator spacer on the sides of the narrow tungsten-polysilicon gate structure. Heavily doped source and drain regions are next formed followed by contact metallization procedures.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

Figure 1:
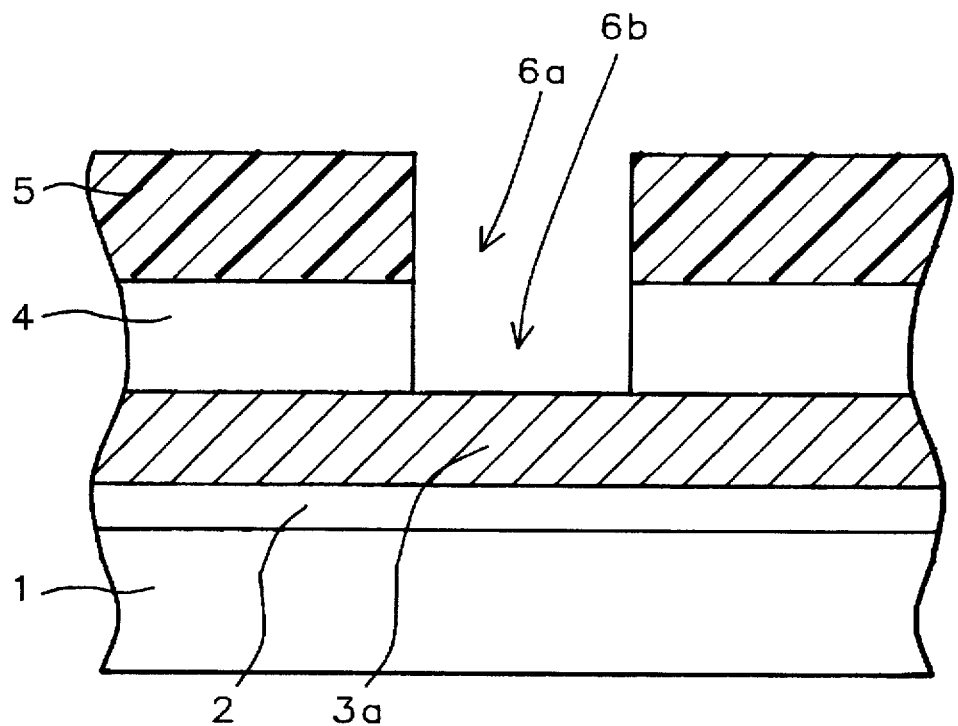
FIGS. 1–6, which schematically, in cross-sectional style, show the fabrication stages used to create a deep submicron MOSFET device, with a narrow tungsten-polysilicon gate structure, self aligned to an underlying local, narrow threshold voltage adjust region.

The method for creating a deep submicron MOSFET device will now be covered in detail. Deep submicron is referred to as a dimension of less than 0.35 uM in width, and a deep submicron MOSFET device is referred to a MOSFET device with a submicron channel length of less than 0.35 uM. A P type, single crystalline silicon substrate, 1, with a <100> crystallographic orientation, shown in FIG. 1, is used. Field oxide regions, (not shown in the drawings), comprised of between about 4000 to 6000 Angstroms of thermally grown silicon dioxide, are formed for purposes of isolation. A silicon dioxide layer, 2, to be used as the gate insulator layer for the MOSFET device, is thermally grown on the top surface of semiconductor substrate, 1, in an oxygen-steam ambient, at a temperature between about 850° to 1000° C., to a thickness between about 50 to 200 Angstroms. A polysilicon layer, 3a, is next deposited, using low pressure chemical vapor deposition, (LPCVD), procedures, at a temperature between about 525° to 575° C., to a thickness between about 500 to 2000 Angstroms. Polysilicon layer, 3a, can either be deposited intrinsically, and doped via ion implantation of phosphorous or arsenic, at an energy between about 25 to 75 KeV, at a dose between about 1E14 to 1E16 atoms/cm$^2$, or grown via insitu doping procedures by the addition of either arsine or phosphine to the silane ambient. FIG. 1, schematically shows these layers.

A thick insulator layer of silicon oxide, 4, is next deposited using LPCVD procedures, at a temperature between about 700° to 800° C., to a thickness between about 2000 to 5000 Angstroms. A photoresist layer, 5, with a narrow opening, or deep submicron opening, 6a, between about 0.20 to 0.50 uM, in width, is next formed on the surface of insulator layer, 4. A RIE procedure, using $CHF_3$ as an etchant, is next used to create a narrow hole opening, or a deep submicron hole opening, 6b, in insulator layer, 4, using the narrow opening 6a, in photoresist layer, 5, as a mask. The result of these processes are also shown schematically in FIG. 1. In this sequence the selectivity of the RIE procedure allows the etching procedure to terminate at the top surface of polysilicon layer, 3a, producing the narrow hole opening, 6b, with a width identical to the width of the narrow opening, 6a, in photoresist layer, 5, again between about 0.20 to 0.50 uM, in width.

Figure 2:
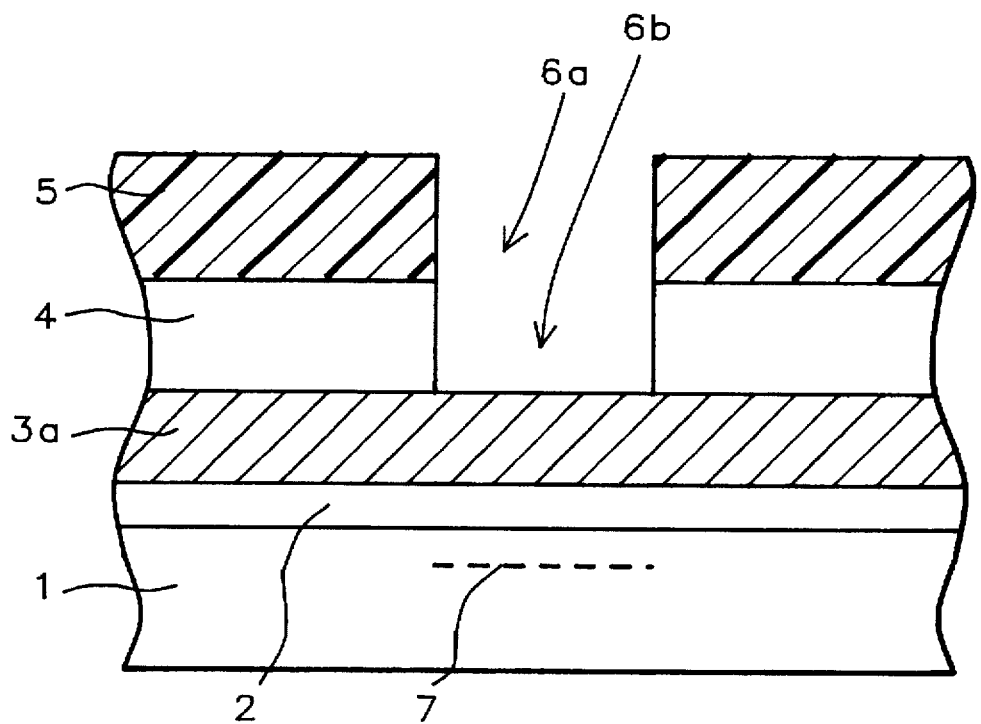

A critical stage of this invention, the creation of a local, narrow threshold voltage adjust region, 7, is next addressed. An ion implantation of boron, at an energy between about 10 to 50 KeV, at a dose between about 1E11 to 1E13 atoms/cm$^2$, is used to place threshold voltage adjust region, 7, in semiconductor substrate, 1. This critical ion implantation procedure is performed at an energy great enough to penetrate polysilicon layer, 3a, and gate insulator layer, 2, in narrow hole opening, 6b. (This ion implantation procedure can be performed prior to polysilicon deposition, if desired, necessitating a different process sequence then now disclosed). The narrow, local threshold voltage adjust region, 7, shown schematically in FIG. 2., is self aligned to the narrow hole opening, 6b, thus this narrow, local threshold voltage adjust region, 7, with only a narrow width of higher doping, will subsequently allow less junction capacitance to result then counterparts fabricated with wider, threshold voltage adjust regions.

Figure 3:
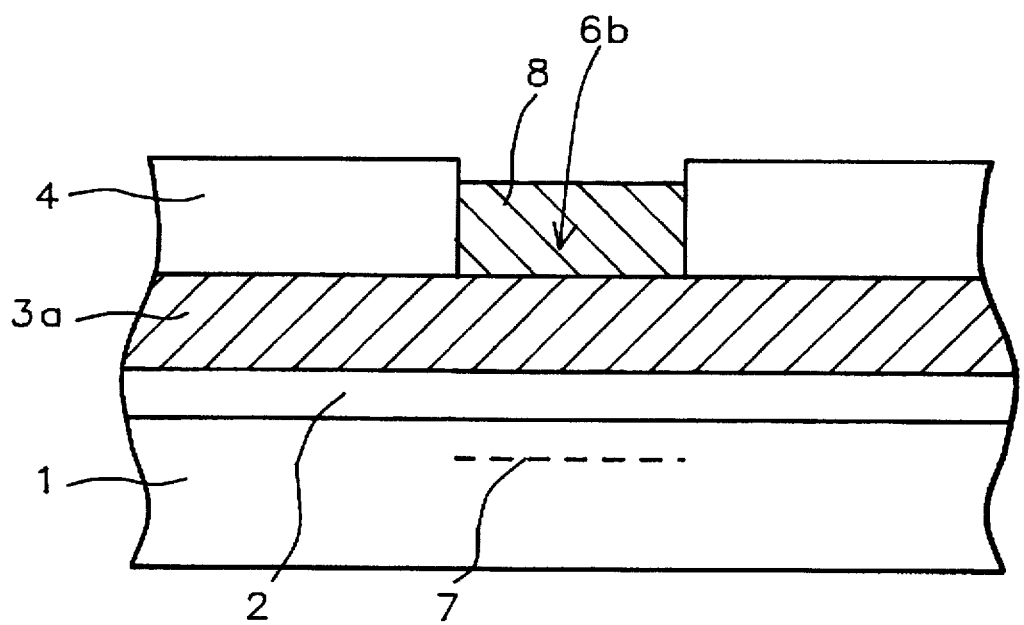

After removal of photoresist layer, 5, via plasma oxygen ashing and careful wet cleans, a tungsten layer, 8, is selectively deposited on the exposed top surface of polysilicon layer, 3a. Tungsten layer, 8, is selectively deposited using LPCVD procedures, at a temperature between about 350° to 450° C., to a thickness between about 500 to 2000 Angstroms, using tungsten hexafluoride, silane and hydrogen. Since tungsten layer, 8, functioning as a narrow tungsten gate structure, is recessed in narrow hole opening, 6b, due to the difference in thickness between thicker insulator layer, 4, and thinner tungsten gate structure, 8. FIG. 3, schematically shows the result of this selective LPCVD tungsten deposition.

Figure 4:
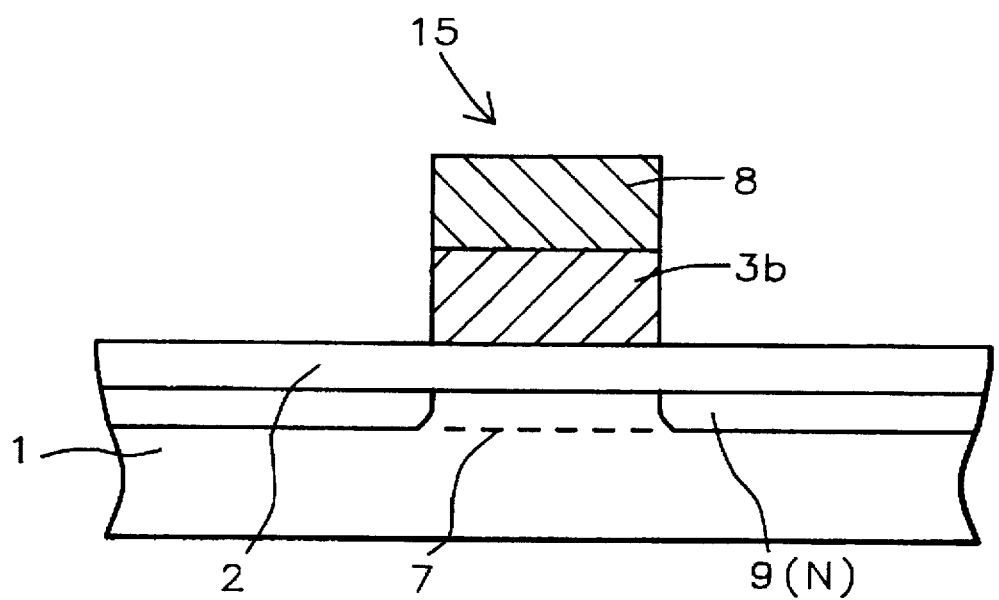

Insulator layer, 4, is next removed via a wet etch procedure, using a solution of buffered hydrofluoric acid. A RIE procedure, using a fluorine based, or chlorine based etchant, and using the narrow tungsten gate structure, 8, as a mask, is next employed to remove polysilicon layer, 3a, from areas not covered by narrow tungsten gate structure, 8, creating narrow polysilicon gate structure, 3b. The selectivity of this RIE process results in complete removal of the unwanted regions of polysilicon layer, 3a, without significant attack of the masking, narrow tungsten gate structure, 8. This is shown schematically in FIG. 4. The resulting narrow tungsten-polysilicon gate structure, 15, comprised of an overlying, narrow tungsten gate structure, 8, and an underlying, narrow polysilicon gate structure, 3b, is self aligned to the local, narrow threshold voltage adjust region, 7, with the narrow tungsten-polysilicon gate structure, 15, having a width between about 0.20 to 0.50 uM. The tungsten gate structure component of the narrow tungsten-polysilicon gate structure, 15, reduces the resistance of the MOSFET device. The narrow tungsten-polysilicon gate structure, 15, now allows a lightly doped source and drain region, 9 to be created, via an ion implantation of phosphorous, at an energy between about 20 to 40 KeV, at a dose between about 1E13 to 1E14 atoms/cm$^2$. This is also schematically shown in FIG. 4.

Figure 5:
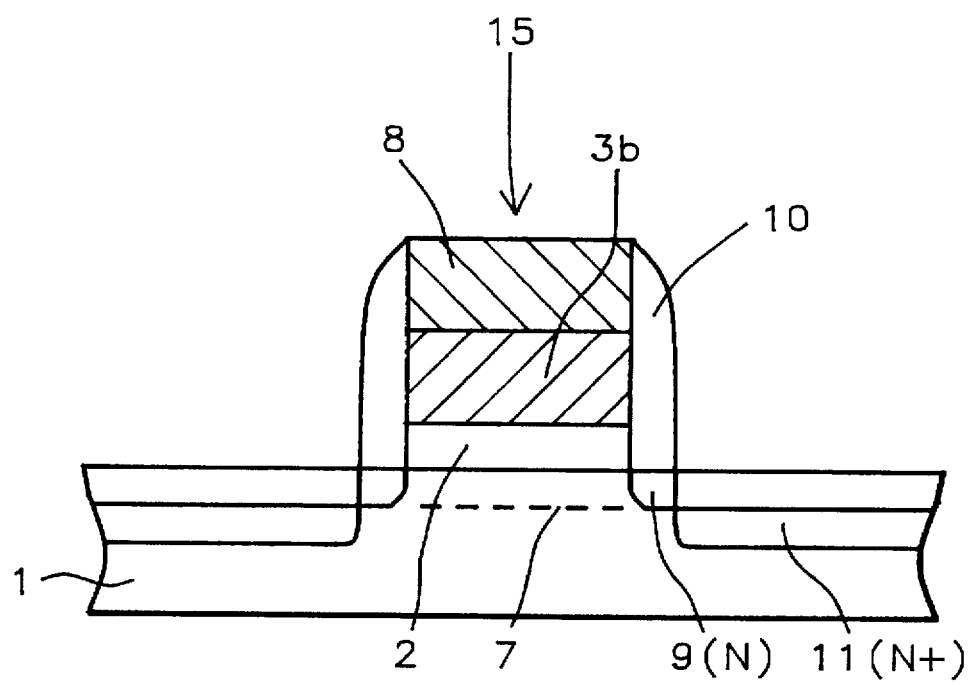
Figure 6:
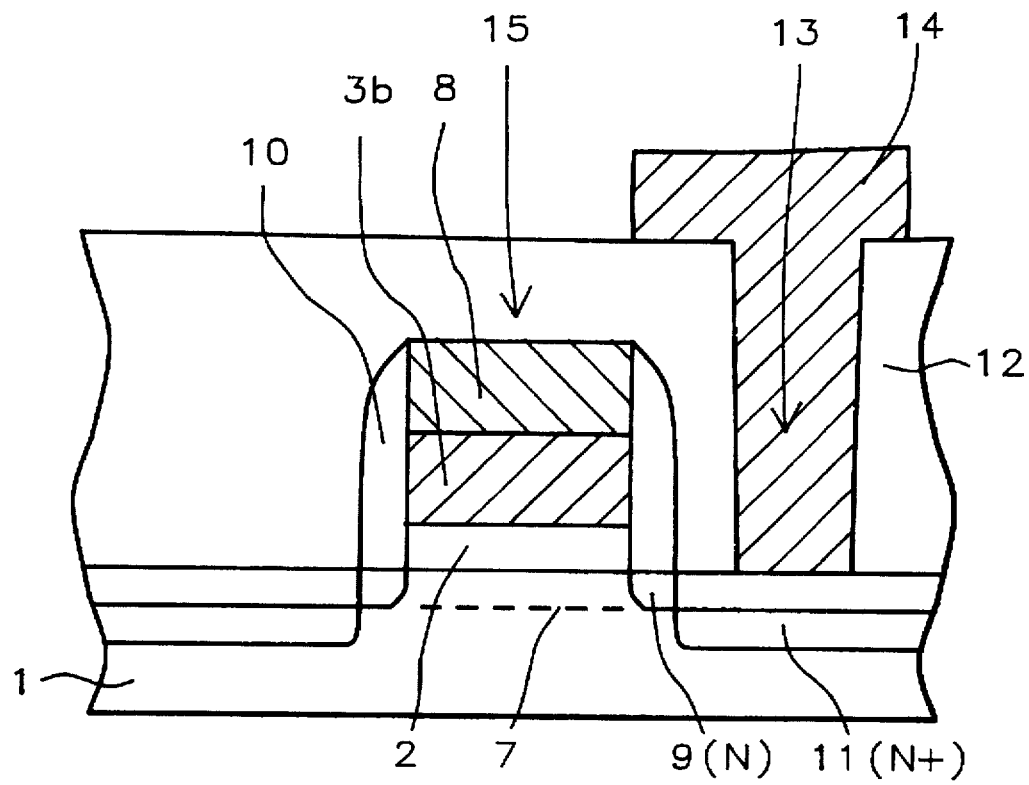

Another insulator layer of silicon oxide, is next deposited using LPCVD or PECVD procedures, at a temperature between about 700° to 750° C., to a thickness between about 1000 to 2500 Angstroms, using tetraethylorthosilicate, (TEOS), as a source. An anisotropic, RIE procedure, using $CHF_3$ as an etchant, is used to create insulator spacer, 10, schematically shown in FIG. 5. Also shown in FIG. 5, is the creation of a heavily doped source and drain region, 11, formed via ion implantation of arsenic at an energy between about 30 to 80 KeV, at a dose between about 1E15 to 5E16 atoms/cm$^2$. FIG. 6, schematically details the processes used to create the metal contacts to the deep submicron MOSFET device. A silicon oxide layer, 12, is deposited using PECVD procedures, at a temperature between about 300° to 600° C., to a thickness between about 4000 to 8000 Angstroms. Conventional photolithographic and RIE procedures, using $CHF_3$ as an etchant, are used to create contact hole, 13, to heavily doped source and drain region, 11. An opening to narrow tungsten-polysilicon gate structure, 15, is also created in silicon oxide layer, 12, however not shown in FIG. 6. The photoresist pattern, (not shown in FIG. 8), is then removed using plasma oxygen ashing and careful wet cleans. A metallization layer comprised of aluminum, containing between about 1 to 3% copper, and between about 0.5 to 2% silicon, is deposited using r.f. sputtering procedures, to a thickness between about 3000 to 8000 Angstroms. Conventional photolithographic and RIE procedures, using $Cl_2$ as etchant, are used to create metal contact structure, 14, shown schematically in FIG. 6. Photoresist removal is once again accomplished using plasma oxygen ashing and careful wet cleans.

This process for creating a deep submicron MOSFET device, using a narrow, local threshold voltage adjust region, although shown for the creation of an N channel, of NFET device can easily be used to create a P channel, or PFET device. This process can also be used to fabricate complimentary, (CMOS), or bipolar, (BiCMOS), devices.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a MOSFET device, on a semiconductor substrate, with a narrow metal-polysilicon gate structure, self aligned to a local, narrow threshold voltage adjust region, comprising the steps of:

growing a first insulator layer, to be used as a gate insulator layer, on said semiconductor substrate;

depositing a polysilicon layer on said gate insulator layer;

depositing a second insulator layer on said polysilicon layer;

forming a photoresist pattern on said second insulator layer, with a narrow opening in said photoresist pattern, exposing top surface of said polysilicon layer;

forming a narrow hole opening, in said second insulator layer, by removing said second insulator layer from said narrow opening in said photoresist pattern;

ion implanting a first conductivity imparting dopant, through said polysilicon layer, through said gate insulator layer, and into an area of said semiconductor substrate, defined by said narrow hole opening, to create said local, narrow threshold voltage adjust region;

selectively depositing a first metal layer on the top surface of said polysilicon layer, exposed in said narrow hole opening in said second insulator layer, forming a narrow metal gate structure, overlying said polysilicon layer, in said narrow hole opening;

removal of said second insulator layer, from the top surface of said polysilicon layer;

patterning of said polysilicon layer, using said narrow metal gate structure as a mask, to create said narrow metal-polysilicon gate structure, comprised of overlying, said narrow metal gate structure, and underlying, narrow polysilicon gate structure, with said narrow metal-polysilicon gate structure, overlying, and self aligned to, said local, narrow threshold voltage adjust region; and forming lightly doped source and drain regions, an insulator spacer, and heavily doped source and drain regions, adjacent to said narrow metal-polysilicon gate structure.

2. The method of claim 1, wherein said first insulator layer, used as said gate insulator layer, is silicon dioxide, thermally grown in an oxygen-steam ambient, at a temperature between about 850° to 1000° C., to a thickness between about 50 to 200 Angstroms.

3. The method of claim 1, wherein said polysilicon layer is deposited using LPCVD procedures, at a temperature between about 525° to 575° C., to a thickness between about 500 to 2000 Angstroms.

4. The method of claim 1, wherein said second insulator layer is silicon oxide, deposited using LPCVD procedures, at a temperature between about 700° to 800° C., to a thickness between about 2000 to 5000 Angstroms.

5. The method of claim 1, wherein said narrow opening, in said photoresist layer, is between about 0.20 to 0.50 uM, in width.

6. The method of claim 1, wherein said narrow hole opening, in said second insulator layer, is between about 0.20 to 0.50 uM, in width, formed via anisotropic RIE procedures, using $CHF_3$ as an etchant.

7. The method of claim 1, wherein said first conductivity imparting dopant, used to create said local, narrow threshold adjust region, in an area of said semiconductor substrate defined by said narrow hole opening in said second insulator layer, is boron, ion implanted at an energy between about 10 to 50 KeV, at a dose between about 1E11 to 1E13 atoms/$cm_2$.

8. The method of claim 1, wherein said first metal layer is tungsten, selectively deposited, on top surface of said polysilicon layer, forming said narrow metal gate structure in said narrow hole opening, via LPCVD procedures, at a temperature between about 350° to 450° C., to a thickness between about 500 to 2000 Angstroms, using tungsten hexafluoride, silane and hydrogen.

9. The method of claim 1, wherein said second insulator layer is removed using a solution of buffered hydrofluoric acid.

10. The method of claim 1, wherein said narrow polysilicon gate structure is formed via RIE patterning of said polysilicon layer, using said narrow metal gate structure as a mask, and using a fluorine based, or a chlorine based, gas as an etchant, creating said narrow metal-polysilicon gate structure, with a width between about 0.20 to 0.50 uM, self aligned to said local, narrow threshold adjust region, and comprised of an overlying, said narrow metal gate structure, at a thickness between about 500 to 2000 Angstroms, and an underlying, said polysilicon gate structure, at a thickness between about 500 to 2000 Angstroms.

11. A method of fabricating a deep, submicron MOSFET device, on a semiconductor substrate, with a narrow tungsten-polysilicon gate structure, self aligned to a local, narrow threshold voltage adjust region, comprising the steps of:

growing a first insulator layer, to be used as a gate insulator layer, on said semiconductor substrate;

depositing a polysilicon layer on said gate insulator layer;

depositing a second insulator layer on said polysilicon layer;

forming a photoresist pattern on said second insulator layer, with a deep submicron opening in said photoresist pattern, exposing top surface of said polysilicon layer;

forming a deep submicron hole opening, in said second insulator layer, by removing said second insulator layer, from an area defined by said deep submicron opening in said photoresist pattern;

ion implanting a first conductivity imparting dopant through said polysilicon layer, through said gate insulator layer, and into an area of said semiconductor substrate, defined by said deep submicron hole opening, to create said local, narrow threshold voltage adjust region;

selectively depositing a tungsten layer on the top surface of said polysilicon layer, exposed in said deep submicron hole opening, in said second insulator layer, forming a narrow tungsten gate structure, overlying said polysilicon layer, in said deep submicron hole opening;

removal of said second insulator layer, from the top surface of said polysilicon layer;

patterning of said polysilicon layer, not covered by said narrow tungsten gate structure, to create said narrow tungsten-polysilicon gate structure, comprised of an overlying, narrow tungsten gate structure, and an underlying, narrow polysilicon gate structure, with said narrow tungsten-polysilicon gate structure, overlying, and self aligned to, said local, narrow threshold voltage adjust region;

ion implanting a second conductivity imparting dopant into an area of said semiconductor substrate, not covered by said narrow tungsten-polysilicon gate structure, to form a lightly doped source and drain region;

depositing a third insulator layer on said semiconductor substrate, and on said narrow tungsten-polysilicon gate structure;

anisotropic etching of said third insulator layer to form an insulator spacer on the sides of said narrow tungsten-polysilicon gate structure;

ion implanting a third conductivity imparting dopant into an area of said semiconductor substrate, not covered by said narrow tungsten-polysilicon gate structure, and not covered by said insulator spacer, to form a heavily doped source and drain region;

depositing a fourth insulator layer on said semiconductor substrate, and on said narrow tungsten-polysilicon gate structure;

opening a contact hole in said fourth insulator layer, to expose top surface of said heavily doped source and drain regions, and to expose top surface of said narrow tungsten-polysilicon gate structure;

depositing a metal layer on the top surface of said fourth insulator layer, on the top surface of said heavily doped source and drain region, and on top surface of said narrow tungsten-polysilicon gate structure, exposed in said contact hole; and patterning of said metal layer to form metal contact structures to said heavily doped source and drain region, and to said narrow tungsten-polysilicon gate structure.

12. The method of claim 11, wherein said first insulator layer, used as said gate insulator layer, is silicon dioxide, thermally grown, in an oxygen-steam ambient, at a temperature between about 850° to 1000° C., to a thickness between about 50 to 200 Angstroms.

13. The method of claim 11, wherein said polysilicon layer is deposited using LPCVD procedures, at a temperature between about 525° to 575° C., to a thickness between about 500 to 2000 Angstroms.

14. The method of claim 11, wherein said second insulator layer is silicon oxide, deposited using LPCVD procedures, at a temperature between about 700° to 800° C., to a thickness between about 2000 to 5000 Angstroms.

15. The method of claim 11, wherein said deep submicron opening, in said photoresist layer, is between about 0.20 to 0.50 uM, in width.

16. The method of claim 11, wherein said deep submicron hole opening, in said second insulator layer, is between about 0.20 to 0.50 uM, in width, formed via anisotropic RIE procedures, using $CHF_3$ as an etchant.

17. The method of claim 11, wherein said first conductivity imparting dopant, used to create said local, narrow threshold voltage adjust region, in an area of said semiconductor substrate defined by said deep submicron hole opening, is boron, ion implanted at an energy between about 10 to 50 KeV, at a dose between about 1E11 to 1E13 atoms/cm$^2$.

18. The method of claim 11, wherein said tungsten layer is selectively deposited, on the top surface of said polysilicon layer, forming said narrow tungsten gate structure in said deep submicron hole opening, using LPCVD procedures, at a temperature between about 350° to 450° C., to a thickness between about 500 to 2000 Angstroms, using tungsten hexafluoride, silane, and hydrogen.

19. The method of claim 11, wherein said second insulator layer is removed via use of a buffered hydrofluoric acid solution.

20. The method of claim 11, wherein said narrow polysilicon gate structure is formed via RIE patterning of said polysilicon layer, using said narrow tungsten gate structure as a mask, and using a fluorine based, or chlorine based etchant, creating said narrow tungsten-polysilicon gate structure, with a width between about 0.20 to 0.50 uM, self aligned to underlying, said local, narrow threshold voltage adjust region, and comprised of overlying, said narrow tungsten gate structure, at a thickness between about 500 to 2000 Angstroms, and underlying, said narrow polysilicon gate structure, at a thickness between about 500 to 2000 Angstroms.

* * * * *